United States Patent [19]
Botti et al.

[11] Patent Number: 5,365,188
[45] Date of Patent: Nov. 15, 1994

[54] SELF-CONFIGURABLE, DUAL BRIDGE, POWER AMPLIFIER

[75] Inventors: Edoardo Botti, Vigevano; Guido Brasca, Varese, both of Italy

[73] Assignee: SGS-Thomson Microelectronics S.r.l., Agrate Brianza, Italy

[21] Appl. No.: 192,858

[22] Filed: Feb. 7, 1994

[30] Foreign Application Priority Data

Feb. 24, 1993 [EP] European Pat. Off. ......... 93830070.4

[51] Int. Cl.$^5$ .............................................. H03F 3/68
[52] U.S. Cl. ........................................ 330/51; 330/84; 330/124 R; 330/146; 330/295
[58] Field of Search ............... 330/51, 84, 124 R, 146, 330/295; 381/120, 121

[56] References Cited

U.S. PATENT DOCUMENTS 3,944,941 3/1976 Tsuda .
4,494,077 1/1985 Fukaya .
5,194,821 3/1993 Brambilla et al. .................... 330/51

FOREIGN PATENT DOCUMENTS 2452854 10/1980 France ........................... H05K 1/02

Primary Examiner—James B. Mullins
Attorney, Agent, or Firm—Wolf, Greenfield & Sacks

[57] ABSTRACT

A self-configurable, dual bridge, power amplifier has a window comparator sensing the level of input signals fed to the amplifier which drives a plurality of configuring switches capable of configuring the amplifier as a single bridge amplifier driving a first and a second loads connected in series or as two distinct bridge amplifiers each driving one of the two loads. As long as the two levels of the input signals remain comprised between a range defined by a negative voltage reference and a positive voltage reference, the amplifier is configured as a single bridge driving the two loads in series, thus reducing sensibly power dissipation.

8 Claims, 9 Drawing Sheets

5,365,188

SELF-CONFIGURABLE, DUAL BRIDGE, POWER AMPLIFIER

BACKGROUND OF THE INVENTION

1. Field of the invention

The present invention relates to a self configurable, dual bridge, power amplifier having a considerably reduced consumption as compared with a dual bridge amplifier of a conventional type, for the same output power rating.

2. Discussion of the Related Art

In many applications and particularly in audio equipments, the low frequency, power amplifiers that drive the loudspeakers very often have a so-called bridge configuration. When employing integrated amplifiers in such a configuration, it is possible to achieve an output power rating of about 20W as compared to an output power of about 5W that could be obtained by the same integrated amplifiers in a single-ended configuration.

On the other hand, the output power stages of car radios or of comparable audio systems often have four "channels": right-front, left-front, right-rear and left-rear, in order to permit a uniform sound diffusion in the compartment by adjusting attenuation on the different channels.

Four, 20W, power amplifiers imply a maximum power dissipation which may be about $4 \times 12 = 48W$. Because of a required compactness of car radio and similar audio systems, such a power can hardly be dissipated if not on account of a relatively high internal temperature of the apparatus. On the other hand, a high working temperature may be detrimental for the magnetic tape of a cassette or for an optical compact disk (CD), the drives of which are often installed inside a single cabinet of the audio apparatus.

From the above considerations, it is clear that there is a need or utility for a bridge amplifier having a substantially reduced dissipation for a certain maximum power that can be delivered to multiple external loads.

SUMMARY OF THE INVENTION

The above noted technical problems are substantially overcome by the circuit object of the present invention based on a dual bridge amplifier composed of four operational power amplifiers, which are connectable in either a first or a second configuration. In a first configuration the functional circuit is equivalent to that of a single bridge amplifier driving a load equivalent to a first and to a second load, connected in series. In a second configuration, the circuit is functionally equivalent to that of two distinct bridge amplifiers, each driving one and the other, respectively, of said first and second loads. A window comparator, that is a comparator having a dual threshold, generates a configuring signal of the four power amplifiers either in said first or second configuration, depending on the instantaneous value of the signals fed to two input terminals of the amplifier. The configuring devices may be constituted by a pair of switches, a single pole and a two-pole switch, respectively, driven by the signal generated by the window comparator. Of course, each switch may be functionally implemented by employing a plurality of monopolar switches, driven in phase opposition among each other by the comparator signal, for example by employing driving inverters where necessary.

Basically, when the level of the signals fed to the two inputs of the window comparator have an amplitude that remains within the "window", as determined by the two threshold voltages of the comparator, that is by a negative threshold voltage and by a positive threshold voltage, the signal present on the output of the comparator causes the positioning of the configuring elements in such a way as to configure the amplifier as a single bridge amplifier driving a first and a second load connected in series. When the instantaneous value of the input signals (or of at least one of them) rises above a certain presettable (absolute) level, the comparator changes state and causes the positioning of the configuring switches so as to determine a configuration represented by two distinct bridge amplifiers, each driving said first and second load, respectively. It is evident that as long as the instantaneous level of the signals remains within the "window" of the comparator, the dissipation remains equal to about a quarter of the dissipation of two distinct bridge amplifiers driving distinct loads. Therefore, a net decrease of the working dissipation of the dual bridge amplifier is achieved.

BRIEF DESCRIPTION OF THE DRAWINGS

The different aspects and advantages of the invention will become more evident through the following description of several important embodiments and by referring to the circuit diagrams shown in the attached drawings, wherein.

For purely illustrative purposes, the selfconfigurable dual bridge amplifier shown in the figures may represent a power audio amplifier of one of two stereo channels of an audio amplifier. The input signals that are fed to the two terminals IN-F and IN-R of the amplifier shown in the figure, may be the same signals, eventually attenuated differently from one another, which drive the two channels, respectively a front and a rear channel, of one stereo channel. This does not exclude that the signals may also be different, although the maximum increase of efficiency, in terms of a reduced power dissipation, is obtained when the input signals as well as the loads that are represented in the figures by the two F and R (front and rear) loudspeakers are identical.

DETAILED DESCRIPTION

Figure 1:
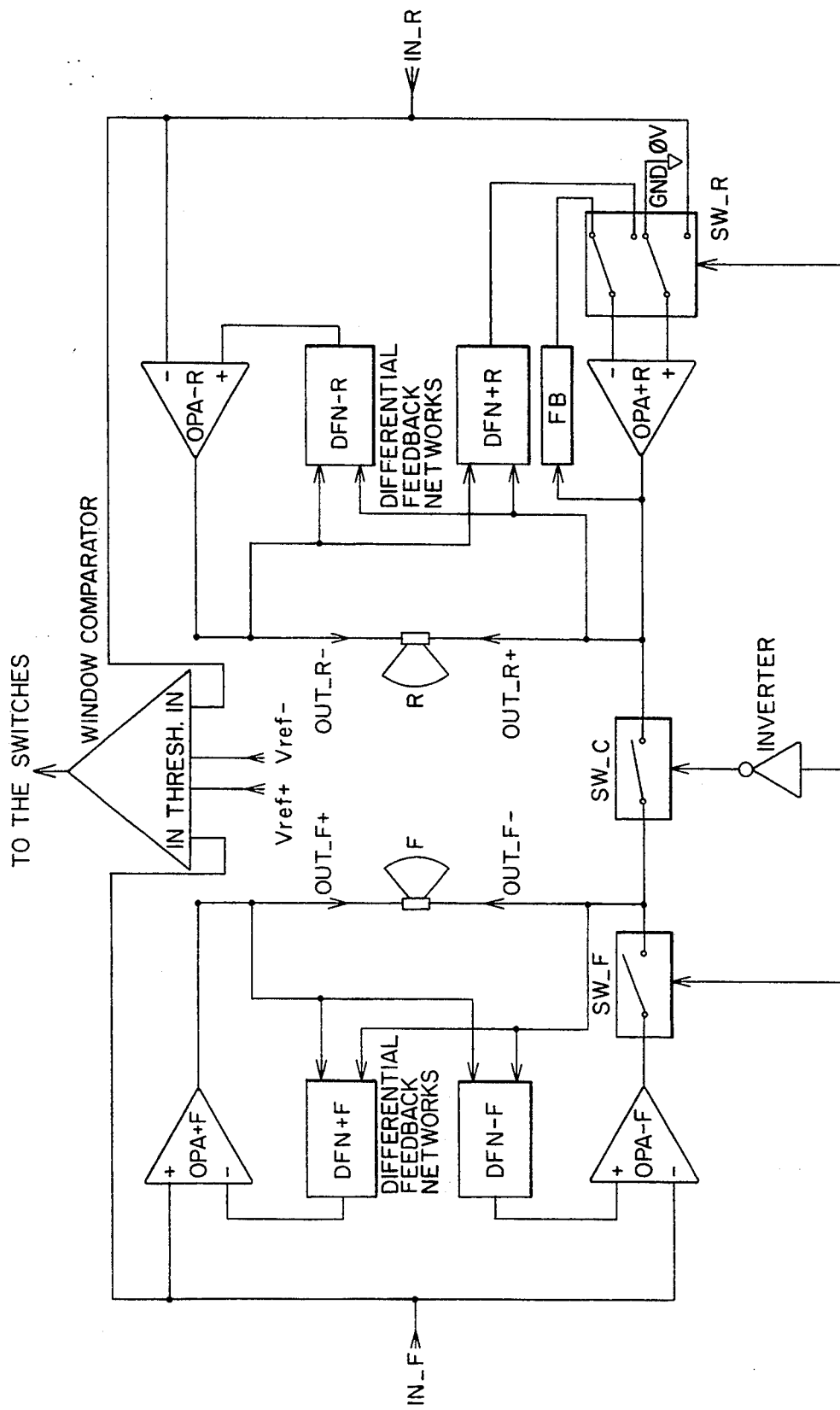
FIG. 1 is a functional block diagram of a selfconfigurable, dual bridge amplifier of the present invention.

The block diagram of FIG. 1 shows, in a schematic fashion, a self-configurable, dual bridge amplifier, made according to the present invention. Essentially the dual bridge amplifier of the invention comprises four power operational amplifiers: OPA+F, OPA−F and OPA−R, OPA+R. Each power amplifier is provided with its own differetial feedback loop in accordance with a common practice, namely: DFN+F, DFN−F and DNF−R, DNF+R, respectively. The dual bridge amplifier further comprises a window comparator (WINDOW COMPARATOR), which drives a plurality of configuring switches, namely: SW_F, SW_C and SW_R.

The fourth power operational amplifier OPA+R is provided with an alternatively selectable, second feedback loop, suitable to configure the amplifier as a buffer (unitary gain). This second feeback loop may be selected in alternative to the first differential feedback loop DFN+R of the same amplifier, by configuring switches driven by the window comparator.

In strictly functional terms, the configuring elements may be constituted by a two-pole switch (SW_R) and by a single-pole power switch, which in the functional diagram of FIG. 1 is represented by two power switches, namely SW_F and SW_C, driven in phase opposition by employing an inverter for driving the second (SW_C) of the two power switches. This second power switch (SW_C) connects in series the two loads that are represented by the two loudspeakers F (for example the front-right loudspeaker) and R (for example the rear-right loudspeaker), respectively.

Essentially, the dual threshold comparator (window comparator) changes state (changes the logic level of the signal present on its output node) in function of the instantaneous value of the signals that are fed to the two inputs of the comparator. In the embodiment shown in FIG. 1, the signals that are applied to the inputs of the configuring comparator are the same signals that are fed to the two inputs IN_F and IN_R of the amplifier. If the amplifier constitutes the output stage of one of two stereo channels, the two input signals may be substantially identical to each other. The two signals may be attenuated differently from one another, for exmaple by means of a dedicated control knob of the apparatus, in order to adjust and optimize sound distribution in a certain interior. The dual triggering thresholds of the comparator, for instantaneous positive values and negative values, respectively, of the input signals, may be preset by employing two reference voltages: Vref+ and Vref−, which determine the respective thresholds of the comparator.

Figure 2:
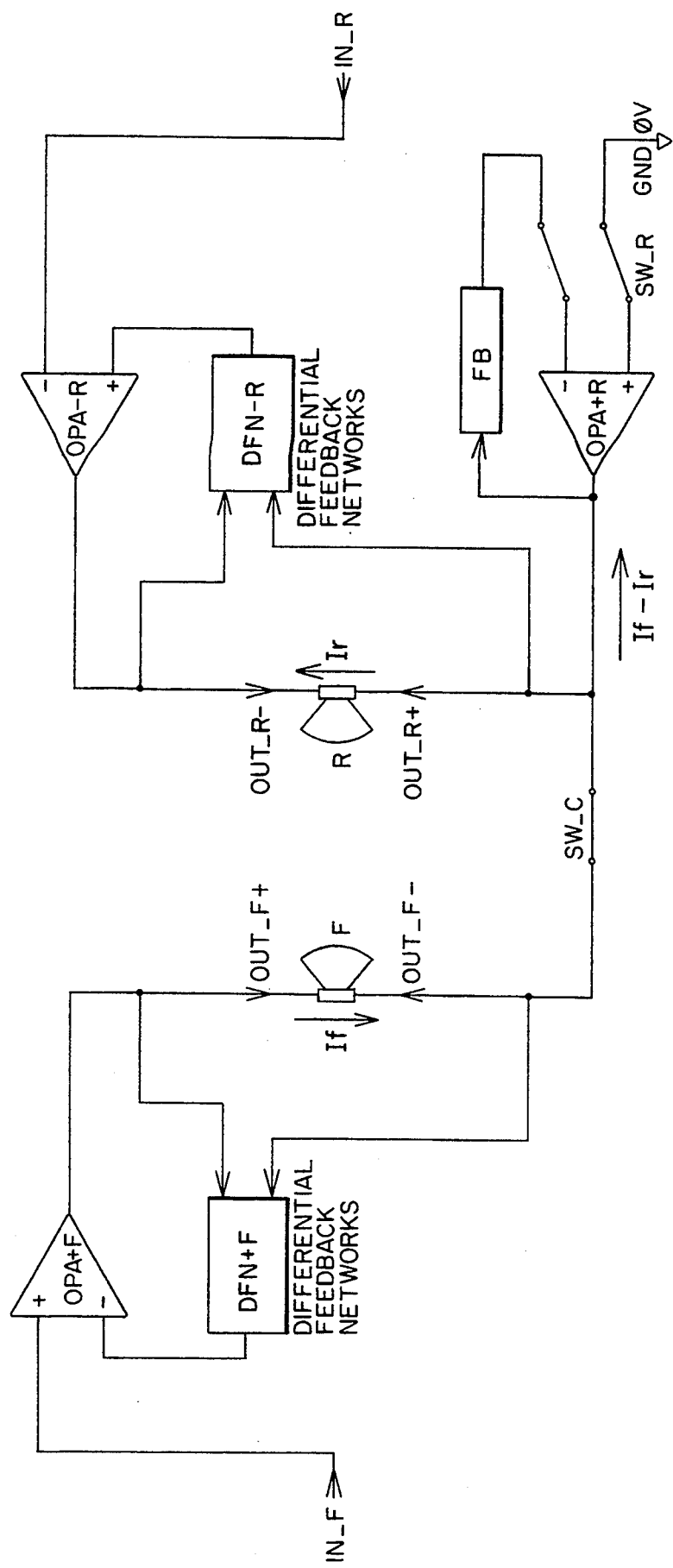
FIG. 2 is a functional diagram of the amplifier configured as a single bridge amplifier driving a load that is equivalent to a first and to a second load connected in series.

As long as the amplitude of the input signals remains within the "window" determined by the positive and negative thresholds (Vref+ and Vref−), the configuring elements will remain positioned so as to configure the functional circuit of the dual bridge amplifier as shown in FIG. 2.

In this configuration, by supposing the signals that are fed to the inputs IN_F and IN_R of the amplifier identical, the differential feedback lines and the operational power amplifiers determine a condition according to which the signal generated on the output terminal OUT_F+ has the same amplitude and an opposite sign as compared to the signal that is generated on the output terminal OUT_R−. Moreover, the fourth operational amplifier, OPA+R, functions substantially as a buffer, having its output node kept at ground potential, while the operational amplifier OPA-F (re: FIG. 1), is practically inactive (practically inexistent) because the switch SW_F is open.

In practice, the power switch SW_F connected to the output of the operational power amplifier OPA-F may be substantially eliminated and its function of "isolating" the respective operational power amplifier OPA-F may be virtually and conveniently performed by placing the amplifier in a state of a high output impedance, that is in a so-called tri-state condition.

In any case, in the configuration of FIG. 2 as assumed by the self-configurable, dual bridge amplifier of FIG. 1, the current that flows through the load F also feeds the load R.

Any difference in the current absorbed by the two loads is eventually absorbed by the buffer-configured operational amplifier OPA+F. Of course, if the loads and the signals are identical the difference of current absorbed by the two loads, namely: If-Ir will be virtually null. Therefore, under these conditions, the dissipated power will be equivalent to that of a single bridge amplifier driving a load having an impedance given by the following relation:

$$Requiv. = (RF + RR)$$

wherein RF and RR are the internal resistances of the two loads F and R. This dissipated power is equal to a quarter of the power that would be dissipated by two distinct bridge amplifiers driving the same loads.

Figure 3:
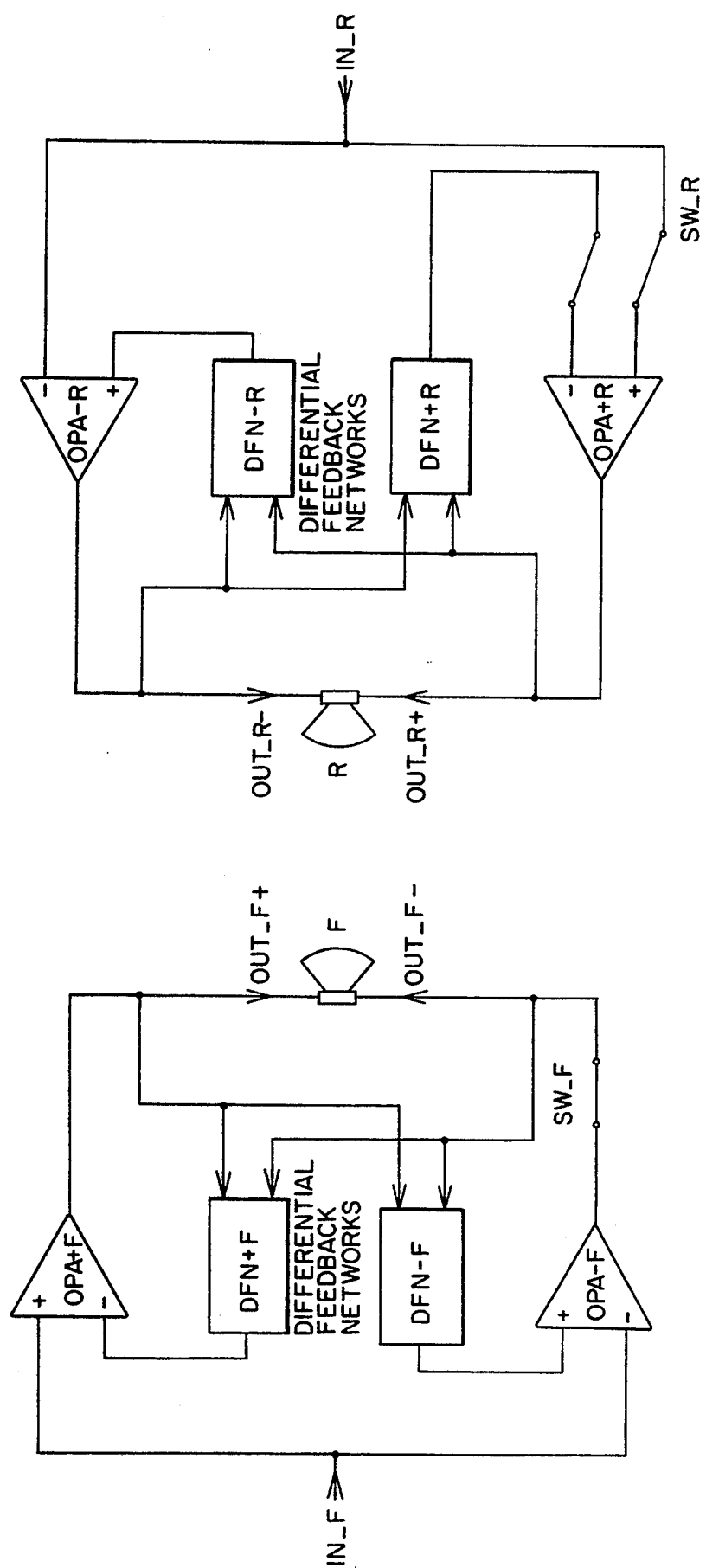
FIG. 3 is a functional diagram of the amplifier of the invention configured as two distinct bridge amplifiers, each driving one of said first and second loads.

When the level of both or of at least one of the two input signals reaches a value beyond one or the other of the two thresholds (Vref+ and Vref−) that define the "window" of the comparator, the configuring elements change state thus determining a configuration of the circuit as depicted in FIG. 3, which represents a normal dual bridge configuration, wherein two, essentially distinct, bridge amplifiers drive their respective loads.

As may be observed from the functional diagrams, the differential feedback of the power operational amplifiers is derived from a load-connection node so that the gain will remain constant notwithstanding a change of configuration. Moreover, an eventual nonlinearity of the power switch SW_C (FIG. 1) will not induce distorsion effects.

The concept according to which the dual threshold comparator (WINDOW COMPARATOR) that drives the configuring elements (SW_F, SW_C and SW_R) is subject to output transitions in function of the instantaneous amplitude of the signals fed to the inputs of the amplifier, does not imply necessarily that the signals fed to the inputs of the amplifier be fed also to the inputs of the comparator. An alternative embodiment of the invention is depicted in the block diagram of FIG. 4, wherein the signals that are actually fed to the inputs of the configuring comparator (window comparator) are derived from the respective connection nodes of the loads F and R, instead of from the input nodes IN_F and IN_R of the amplifier. Of course this alternative embodiment may be employed where the feedback lines DFN+F and DFN−R are such as to be insentive to a direct coupling with the input nodes of the comparator.

Figure 4:
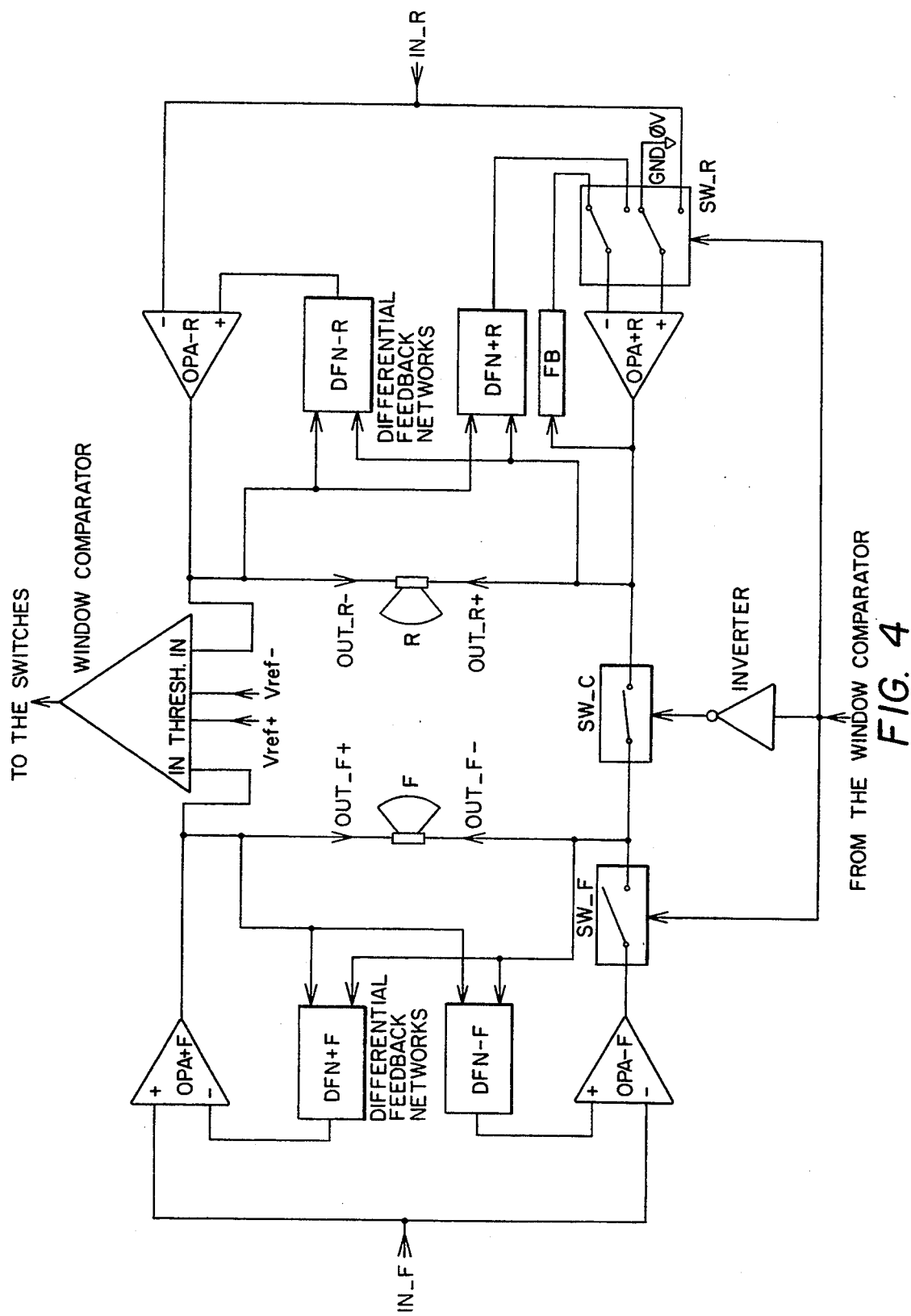
FIG. 4 shows an alternative embodiment of a selfconfigurable, dual bridge amplifier of the invention wherein the configuring window comparator derives the signals present on the output nodes of the amplifiers instead of on the input nodes thereof.
Figure 5:
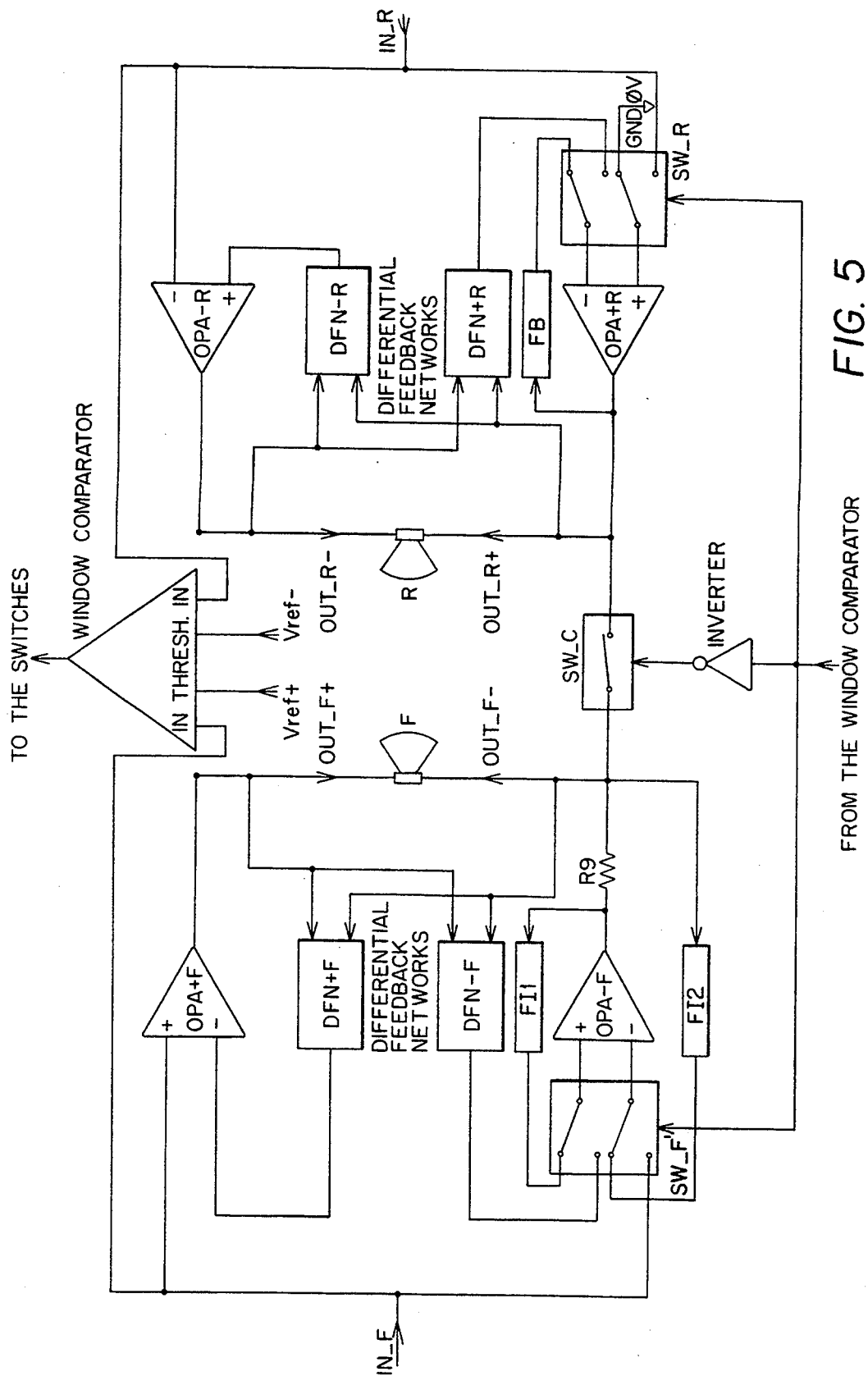
FIG. 5 is a block diagram of an alterantive embodiment of the self-configurable, dual bridge amplifier of the invention.

FIG. 5 shows a functional diagram of another embodiment of the invention, wherein, the function of the power switch SW_F of the functional diagrams of FIGS. 1 and 4, is virtually performed in such a way as not to require the integration of a power device (typically a power MOS transistor) for implementing the switch SW_F. Moreover, this alternative embodiment, does not require the use of an operational amplifier (OPA-F) incorporating a circuit capable of determing a so-called "tri-state" condition of operation, that is a condition of a high output impedance.

This important result is obtained by connecting a resistance R9 having a relatively low value, in series to the output of the operational amplifier OPA-F and by realizing two buffer feeback networks: FI1 and FI2, that are connected to the output of the amplifier OPA-F, before and after, respectively, the series resistance R9. A two-pole switch SW_F', driven by the signal generated by the configuring comparator, switches the inputs of the operational amplifier OPA-F to said buffer feedback lines when the instantaneous level of the input signals of the amplifier remains within the "window" determined by the two reference voltages (positive and negative) Vref+ and Vref− applied to the comparator.

Figure 6:
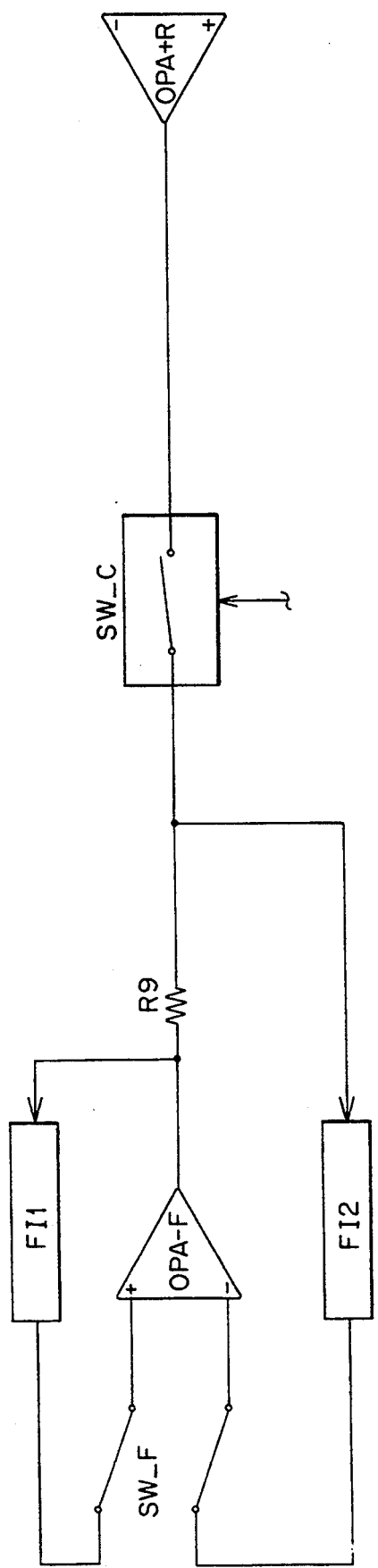
FIG. 6 is a partial block diagram showing the operation of the peculiar self-configuring system of the amplifier of FIG. 5.

In this condition, the operational amplifier OPA-F is configured as shown in the partial diagram of FIG. 6.

In this configuration, the operational amplifier OPA-F is normally powered, but because of the feedback loops connected to the output node of the amplifier before and after the series connected resistance R9 (having a relatively low value, for example 0.1 2), the current that the amplifier may deliver through its output is virtually null (=Voffset/R9). Therefore, the potential assumed by the output node is substantially determined by the rest of the circuit, in practice by the other operational amplifier OPA-R and by the switch SW_C.

Figure 7:
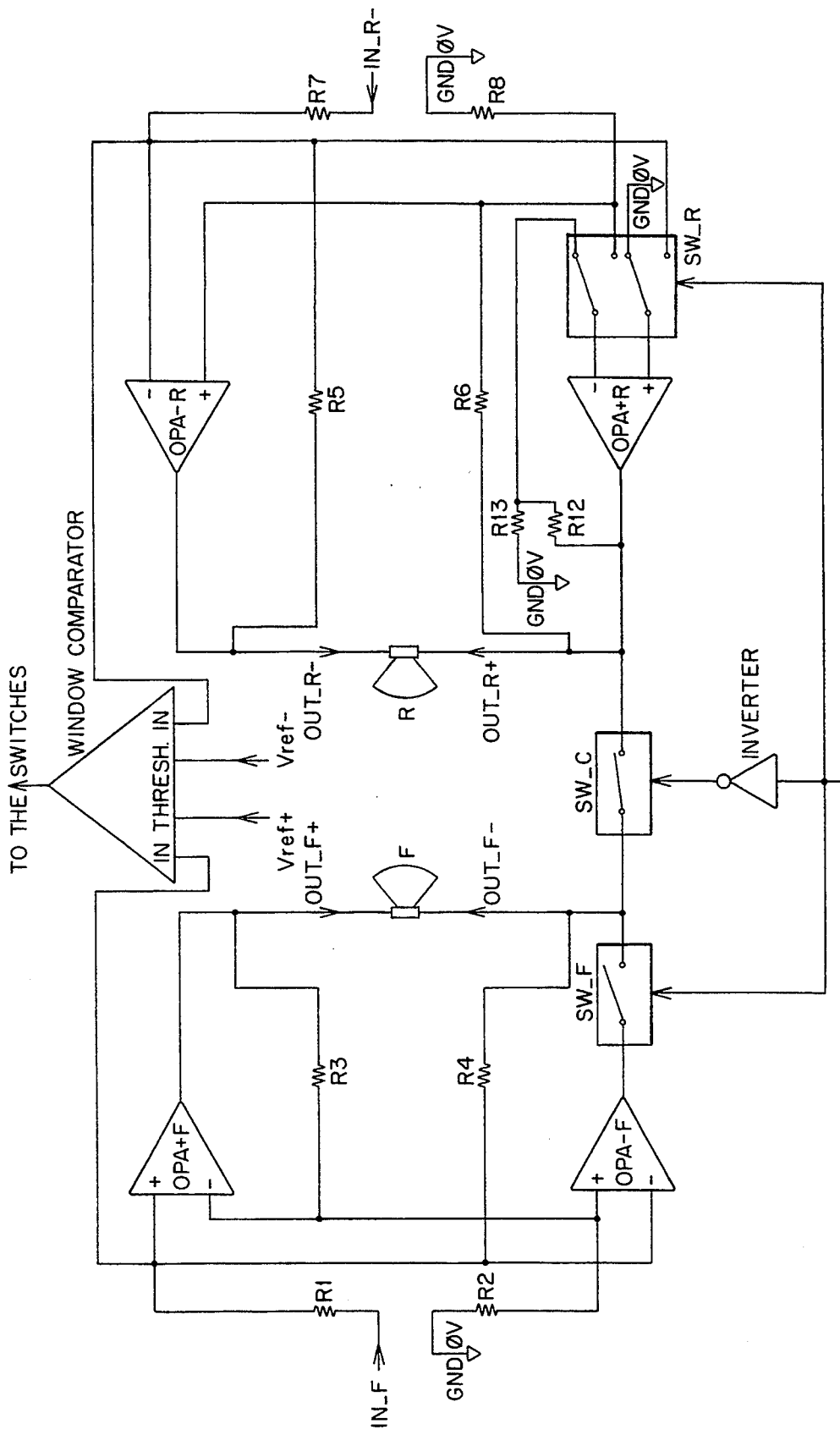
FIG. 7 is a diagram of the amplifier of FIG. 1, wherein selectable feeback loops of the amplifiers are shown in detail.

A circuit diagram of the diagram of FIG. 1, is shown in FIG. 7, wherein an embodiment of the feedback lines of the four operational power amplifiers is shown.

Figure 8:
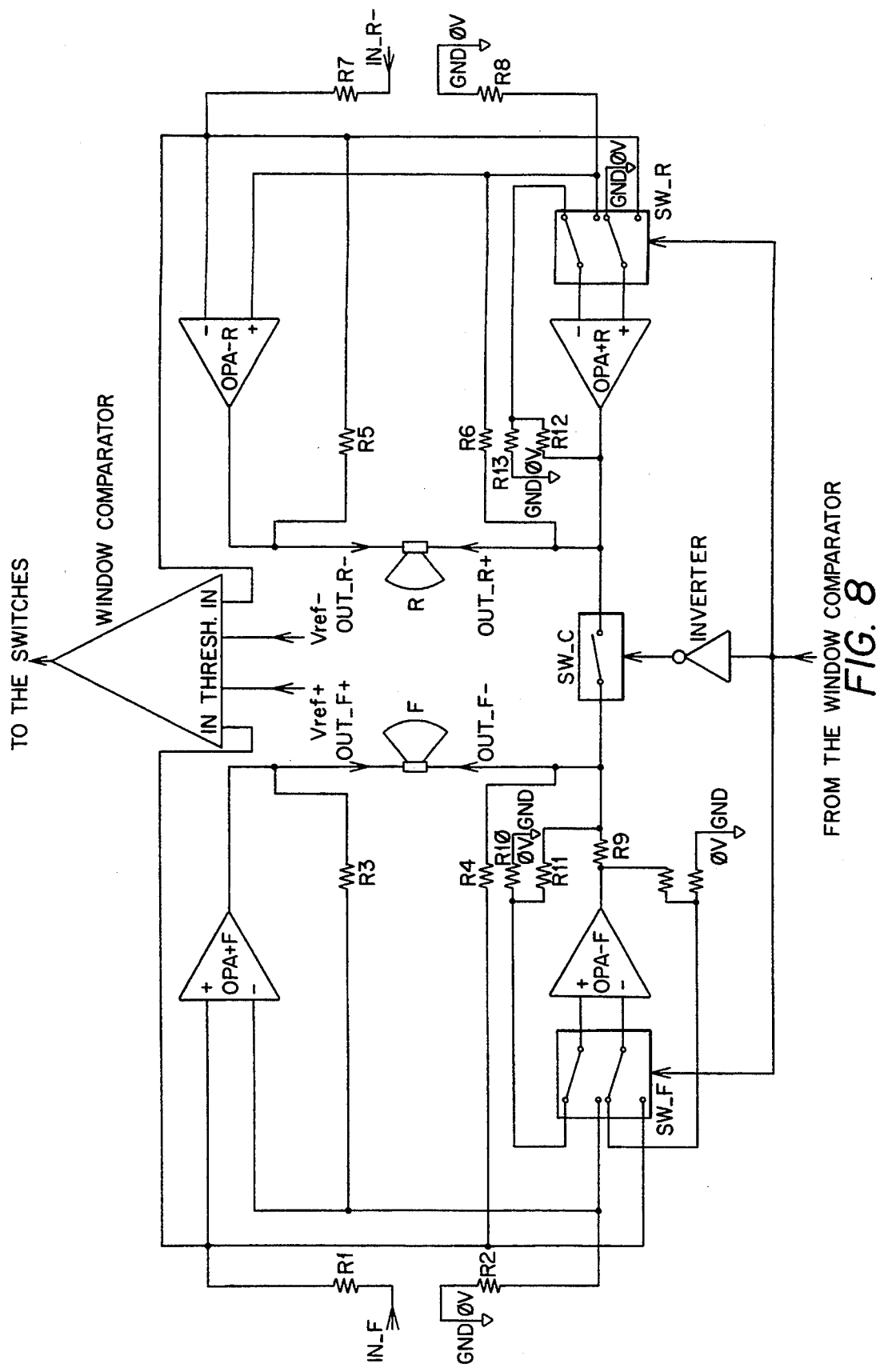
FIG. 8 shows the circuit of the amplifier of FIG. 5, wherein the feedback loops of the four power amplifiers are shown in detail.

A circuit diagram of the diagram of FIG. 5 is shown in FIG. 8, wherein the feedback lines of the four operational power amplifiers are shown in detail.

Figure 9:
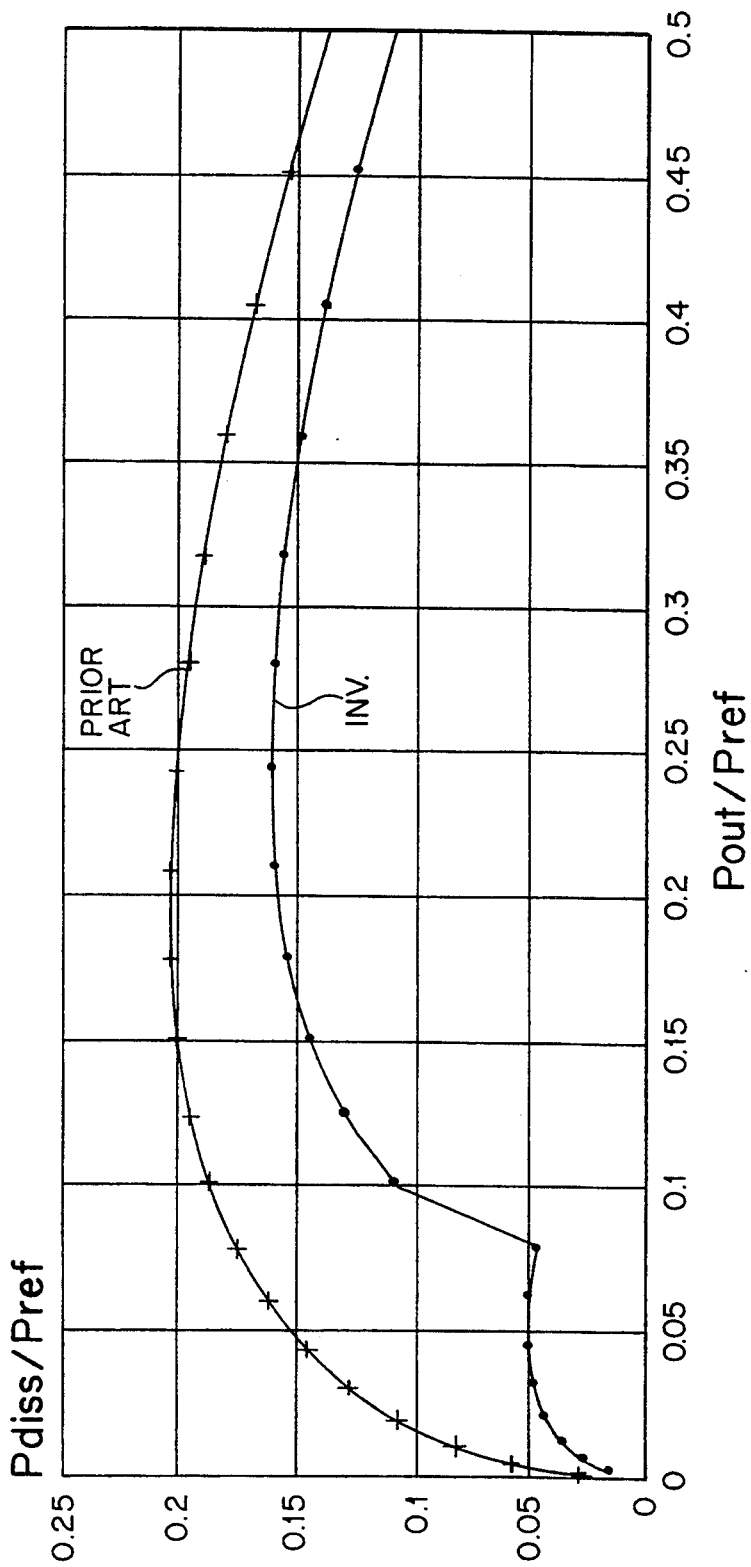
FIG. 9 shows a normalized diagram of the power dissipation in function of the output power of a selfconfigurable, dual bridge amplifier of the invention and of a comparable dual bridge amplifier, made according to the prior art.

The reduction of the dissipated power provided by a self-configurable, dual bridge amplifier of the present invention as compared to a dual bridge amplifier of functionally identical characteristics, but without the self-configuring system of the invention, is graphically shown in FIG. 9. Normalized diagrams of the power dissipation in function of the output power in the case of a conventional type dual bridge amplifier (prior art) and in the case of a self-configurable amplifier of the invention (INV) are shown in the figure.

The self-configurable, dual bridge amplifier of the invention may be entirely integrated and essentially does not require the use of additional components that cannot be integrated, as for example large capacitors.

Of course, a self-configurable, dual bridge amplifier made in accordance with the present invention may also be provided with common mode feedback loops, in accordance with techniques and practices that are well known to a person skilled in the art.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention.

Accordingly, the foregoing description is by way of example only and is limited only as defined in the folowing claims and the equivalents thereto.

What is claimed is:

1. A dual bridge amplifier comprising a first, a second, a third and a fourth operational amplifier connectable in a first comfiguration functionally equivalent to a single bridge amplifier composed of said first and said second amplifiers driving a load equivalent to a first load and to a second load connected in series or in a second configuration functionally equivalent to two distinct bridge amplifiers composed by said first and third amplifier and by said second and fourth amplifiers, respectively, each driving one of said first and second loads, and comprising further a window comparator capable of generating a signal for configuring said four amplifiers in said first or in said second configuration, in function of the instantaneous value of input signals that are fed respectively to a first and a second input terminals of the amplifier by configuring means driven by said configuring signal.

2. Self-configurable amplifier according to claim 1, wherein said configuring means are electronic swithches.

3. Self-configurable amplifier as defined in claim 1, wherein each of said four operational amplifiers has a differential feedback line.

4. Self-configurable amplifier as defined in claim 2, wherein said window comparator generates a configuring signal driving a two pole switch capable of commuting the inputs of said fourth operational amplifier, a power switch capable of isolating the output of said third operational amplifier and, through an inverter, a second power switch capable of connecting in series said two loads.

5. Self-configurable amplifier as defined in claim 4, wherein said two-pole switch commutes the inputs of said fourth amplifier from a connection to a respective input terminal of the amplifier and to a differential feedback line, functional to a configuration of the amplifier as two distinct bridge amplifiers, to a connection to ground and to a buffer feedback line, functional to a single bridge amplifier configuration.

6. Self-configurable amplifier according to claim 2, wherein said electronic switches functionally implement a first two-pole switch capable of commuting the inputs of said fourth amplifier, a second two-pole switch capable of commuting the inputs of said third amplifier and a single-pole power switch capable of connecting in series said loads.

7. Self-configurable amplifier as defined in claim 6, wherein said second two-pole switch commutes the inputs of said third amplifier from a connection to a respective input terminal of the amplifier and to a differential feedback line, functional to a configuration as two distinct bridge amplifiers, to a connection to a first and to a second buffer feedback lines, respectively connected across a series resistance connected to the output node of the amplifier, functional to a single bridge amplifier configuration.

8. A method of reducing power dissipation in a double bridge amplifier characterized by comprising
generating a configuring signal in function of the instantaneous value of signals fed to the input terminals of the amplifier;
driving by said generated .signal a plurality of configuring means capable of configuring the amplifier as a single bridge amplifier, driving a first and a second load connected susbtantially in series as long as the instantaneous value of the input signals is comprised within a window defined by a negative reference voltage and by a positive reference voltage, or as two distinct bridge amplifiers, each driving one of said first and second loads, when the instantaneous value of at least one of the input signals is outside the window defined by said reference voltages.

* * * * *